(12) United States Patent
Kessler

(10) Patent No.: US 11,950,441 B2
(45) Date of Patent: Apr. 2, 2024

(54) ORGANIC ELECTRON-CONDUCTING LAYER HAVING N-DOPANT

(71) Applicant: Siemens Aktiengesellschaft, Munich (DE)

(72) Inventor: Florian Kessler, Wachenroth (DE)

(73) Assignee: SIEMENS AKTIENGESELLSCHAFT, Munich (DE)

( * ) Notice: Subject to any disclaimer, the term of this patent is extended or adjusted under 35 U.S.C. 154(b) by 705 days.

(21) Appl. No.: 16/300,663

(22) PCT Filed: Feb. 21, 2017

(86) PCT No.: PCT/EP2017/053906
§ 371 (c)(1),
(2) Date: Nov. 12, 2018

(87) PCT Pub. No.: WO2017/194213
PCT Pub. Date: Nov. 16, 2017

(65) Prior Publication Data
US 2019/0393438 A1    Dec. 26, 2019

(30) Foreign Application Priority Data
May 13, 2016    (DE) .................. 10 2016 208 298.1

(51) Int. Cl.
*H10K 50/165* (2023.01)
*H10K 50/16* (2023.01)
*H10K 71/30* (2023.01)
*H10K 85/30* (2023.01)

(52) U.S. Cl.
CPC ........... *H10K 50/165* (2023.02); *H10K 50/16* (2023.02); *H10K 50/166* (2023.02); *H10K 71/30* (2023.02); *H10K 85/341* (2023.02); *H10K 85/346* (2023.02); *H10K 85/371* (2023.02)

(58) Field of Classification Search
None
See application file for complete search history.

(56) References Cited

U.S. PATENT DOCUMENTS

| | | | |
|---|---|---|---|
| 2005/0258433 A1* | 11/2005 | Djurovich | H01L 29/08 257/79 |
| 2006/0040132 A1* | 2/2006 | Liao | 428/690 |
| 2006/0258043 A1 | 11/2006 | Bold et al. | 438/99 |
| 2009/0212280 A1* | 8/2009 | Werner | 257/40 |
| 2010/0112471 A1 | 5/2010 | Kanitz et al. | 430/58.5 |
| 2013/0056716 A1 | 3/2013 | Cheng et al. | 257/40 |
| 2014/0131665 A1* | 5/2014 | Xia | H01L 51/0071 |
| 2014/0131687 A1* | 5/2014 | Lin | H01L 51/0085 |
| 2015/0060804 A1 | 3/2015 | Kanitz et al. | 257/40 |
| 2015/0243889 A1 | 8/2015 | Schmid et al. | 438/99 |
| 2015/0255719 A1 | 9/2015 | Kanitz et al. | 136/263 |
| 2016/0104854 A1* | 4/2016 | Jeon | H01L 51/508 |
| 2016/0199875 A1 | 7/2016 | Crudden et al. | 427/249.1 |
| 2017/0170420 A1* | 6/2017 | Ito | H01L 51/5092 |

FOREIGN PATENT DOCUMENTS

| | | | |
|---|---|---|---|
| DE | 103 38 550 A1 | 3/2005 | ............. B01J 31/22 |
| DE | 10 2006 054 523 A1 | 5/2008 | ............. C07F 11/00 |
| DE | 10 2012 205 945 A1 | 10/2013 | ............ C07D 233/64 |
| DE | 10 2012 217 574 A1 | 3/2014 | ............... C08K 5/53 |
| DE | 10 2012 217 587 A1 | 3/2014 | ............. C07C 13/15 |
| EP | 2 092 041 B1 | 9/2010 | ............. C09K 11/06 |
| JP | 2007045742 A * | 2/2007 | ............. C07F 15/00 |
| KR | 20160014205 A * | 2/2016 | ............. C07F 15/00 |
| WO | 2015/024120 A1 | 2/2015 | ............. B32B 15/04 |
| WO | 2017/194213 A1 | 11/2017 | ............. H01L 51/54 |

OTHER PUBLICATIONS

Chung et al. "Effect of cobalt content on the work function of the electrodeposited nickel-cobalt films" Microsyst Technol 2008, vol. 14, p. 1389-1394 (Year: 2008).*
Lee et al., machine translation of KR20160014205A (2016) pp. 1-18. (Year: 2016).*
Akiyama et al., machine translation of JP2007045742A (2007) pp. 1-24. (Year: 2007).*
Dileep A. K. Vezzu et al. "Highly Luminescent Tetradentate Bis-Cyclometalated Platinum Complexes: Design, Synthesis, Structure, Photophysics, and Electroluminescence Application", Inorg. Chem. 2010, vol. 49, p. 5107-5119 (Year: 2010).*
Kessler et al., "Bis(allenylidene) Complexes of Palladium and Platinum", Organometallics, 2010, vol. 29, No. 21, pp. 5154-5161, Aug. 3, 2010.
Wuttke et al., "Palladium Alkynyl and Allenylidene Complexes: Very Efficient Precatalysts for C-C Coupling Reactions", Organometallics, 2011, vol. 30, No. 22, pp. 6270-6282, Nov. 1, 2011.
Jin et al., "Isolation of cationic and neutral (allenylidene) (carbene) and bis(allenylidene)gold complexes", Royal Society of Chemistry; Chemical Science 2016, vol. 7, pp. 150-154, Nov. 14, 2015.

(Continued)

*Primary Examiner* — Dylan C Kershner
*Assistant Examiner* — Seokmin Jeon
(74) *Attorney, Agent, or Firm* — Slayden Grubert Beard PLLC

(57) ABSTRACT

Various embodiments may include an organic electron-conducting layer comprising an n-dopant having the structure:

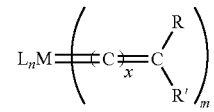

wherein $L_n$ denotes a number n of independently selected ligands L; M is a metal; R and R' comprise compounds independently selected; n is from 0 to 5; m is from 1 to 6; n+m is from 2 to 6; and x has a value of 0, 1 or 2.

15 Claims, 2 Drawing Sheets

(56) References Cited

OTHER PUBLICATIONS

German Office Action, Application No. 10 2016 208 298.1, 9 pages, dated Dec. 19, 2016.
International Search Report and Written Opinion, Application No. PCT/EP2017/053906, 19 pages, dated May 22, 2017.

* cited by examiner

US 11,950,441 B2

ORGANIC ELECTRON-CONDUCTING LAYER HAVING N-DOPANT

CROSS-REFERENCE TO RELATED APPLICATIONS

This application is a U.S. National Stage Application of International Application No. PCT/EP2017/053906 filed Feb. 21, 2017, which designates the United States of America, and claims priority to DE Application No. 10 2016 208 298.1 filed May 13, 2016, the contents of which are hereby incorporated by reference in their entirety.

TECHNICAL FIELD

The present disclosure relates to electronic components. Various embodiments of the teachings herein may include an organic electron-conducting layer comprising an n-dopant, an organic electronic component having a layer of this kind, a process for producing such a layer, and/or the use of an n-dopant for increasing electron conductivity in an organic layer.

BACKGROUND

Electron-conducting layers for organic electronic components may include n-dopants for increasing the electron conductivity embedded into a matrix of an organic electron-conducting material. Such embedding across the entire thickness of the layer is also referred to as "bulk doping", by contrast with the introduction of a thin interlayer at an interface that can also have the effect of improved electron conductivity.

Various substances have already been proposed as n-dopants in electron-conducting layers of this kind. Many of these are salt-type complexes having a positively charged metal atom and a negatively charged organic ligand. For example, DE 10 2012 217 574 A1 describes phosphorus oxo salts as n-dopants. DE 10 2012 217 587 A1 describes salts of cyclopenta-diene as n-dopants. DE 10 2012 205 945 A1 describes an electron donor compound for n-doping of an electron transport layer, where the electron donor compound has at least two cyclic carbene groups bonded via a bridge, where the carbene groups are not bonded directly to one another via a metal-ligand fragment.

SUMMARY

The teachings of the present disclosure may include an organic electron-conducting layer in which strong electron conductivity is achieved with an alternative n-dopant. As and example, some embodiments may include an organic electron-conducting layer (7, 25, 36), comprising an n-dopant having the structure

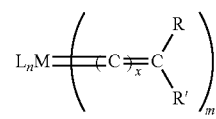

where $L_n$ denotes a number n of ligands L wherein each ligand may be independently selected from the group consisting of alkyls, aryls, alkylaryls, heteroalkyls, heteroaryls, and alkyls, aryls, alkylaryls, heteroalkyls, heteroaryls substituted by functional groups, and the substituted heteroatoms, where M is a metal selected from the group consisting of iron, ruthenium, osmium, cobalt, rhodium, iridium, nickel, palladium, platinum, copper, silver and gold, where R and R' are each independently selected from the group consisting of the alkyls, aryls, alkylaryls, heteroalkyls, heteroaryls, the alkyls, aryls, alkylaryls, heteroalkyls, heteroaryls substituted by functional groups, and the substituted heteroatoms, where n is from 0 to 5,
where m is from 1 to 6,
where n+m is from 2 to 6, and where x has a value of 0, 1 or 2.

In some embodiments, R and/or R' is a substituted heteroatom, especially a substituted nitrogen atom.

In some embodiments, M is selected from the group comprising palladium, platinum, silver and gold.

In some embodiments, the layer forms part of a charge generation layer.

In some embodiments, the layer has a thickness between 10 nanometers and 1000 nano-meters, especially between 20 nanometers and 200 nanometers.

In some embodiments, n is at least two and the at least two ligands L are bridged to one another in the form of a higher ring structure.

In some embodiments, there is, in addition to the n-dopant, a further electron transport material (ETM) and/or electron acceptor material.

In some embodiments, the further electron transport material (ETM) and/or electron acceptor material forms a matrix into which the n-dopant has been mixed, especially with a proportion by volume between 0.01% and 35% by volume.

In some embodiments, the proportion by volume of the n-dopant is between 70% and 100%.

As another example, some embodiments may include an organic electronic component (10, 20, 30) having at least two electrodes (2, 9; 23, 36; 32, 34, 35) and a layer (7, 25, 36) as described above.

In some embodiments, the layer is part of an organic light-emitting diode (10), an organic solar cell (20), an organic photodetector (20) and/or an organic transistor (30).

In some embodiments, there is an organic light-emitting diode which, in addition to the electron-conducting layer, has a separate emitter layer (5) disposed between the electron-conducting layer (7) and at least one of the electrodes (2).

As another example, some embodiments include a process for producing an organic electron-conducting layer (7, 25, 36) as described above, wherein the n-dopant is deposited by means of a sublimation process.

In some embodiments, the n-dopant is deposited within the layer together with at least one electron transport material (ETM).

As another example, some embodiments include the use of an n-dopant having the structure

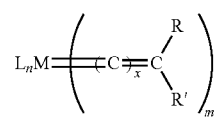

where $L_n$ denotes a number n of ligands L that are independently selected from the group of the alkyls, aryls, alkylaryls, heteroalkyls, heteroaryls, the alkyls, aryls, alkylaryls, heteroalkyls, heteroaryls substituted by functional groups, and the substituted heteroatoms, where M is a metal selected from the group comprising iron, ruthenium, osmium, cobalt, rhodium, iridium, nickel, palladium, platinum, copper, silver and gold, where R and R' are independently selected from the group of the alkyls, aryls, alkylaryls, heteroalkyls, heteroaryls, the alkyls, aryls, alkylaryls, heteroalkyls, heteroaryls substituted by functional groups, and the substituted heteroatoms, where n is from 0 to 5,
where m is from 1 to 6,
where n+m is from 2 to 6
and where x has a value of 0, 1 or 2,
for increasing the electron conductivity of an organic layer (7, 25, 36).

BRIEF DESCRIPTION OF THE DRAWINGS

The structure of organic electrical components that may include a layer as illustrated in detail hereinafter by figures. The figures show.

DETAILED DESCRIPTION

Figure 1:
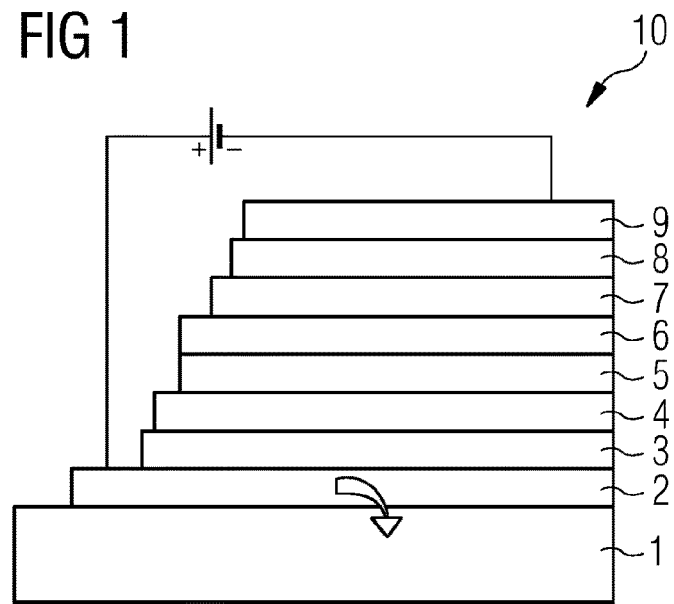
FIG. 1 a schematic of the structure of an organic light-emitting diode (10). The light-emitting diode comprises a glass layer (1); indium tin oxide (ITO) layer (2); hole injector layer (3); hole transport layer (HTL) (4); emitter layer (EML) (5); hole blocker layer (HBL) (6); electron transport layer (ETL) (7); electron injector layer (8) and a cathode layer (9)

The teachings herein may provide an organic electron-conducting layer which comprises an n-dopant having the following general formula (1):

formula (1)

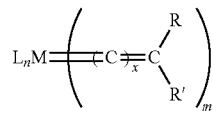

where $L_n$ denotes a number n of ligands L that are selected—also independently of one another—from the group of the alkyls, aryls, alkylaryls, heteroalkyls, heteroaryls, the alkyls, aryls, alkylaryls, heteroalkyls, heteroaryls substituted by functional groups, and the substituted heteroatoms. M is a metal selected from the group comprising iron, ruthenium, osmium, cobalt, rhodium, iridium, nickel, palladium, platinum, copper, silver and gold. R and R' are independently selected from the group of the alkyls, aryls, alkylaryls, heteroalkyls, heteroaryls, the alkyls, aryls, alkylaryls, heteroalkyls, heteroaryls substituted by functional groups, and the substituted heteroatoms. In addition, n is from 0 to 5, m is from 1 to 6, n+m is from 2 to 6, and x has a value of 0, 1 or 2.

In other words, the n-dopant is a metal complex having a total of at least two ligands (n+m is at least 2), where at least one of these ligands (m is at least 1) is a carbene (x=0), a vinylidene (x=1) and/or an allenylidene (x=2). In this context, the at least one latter ligand is bonded directly to the metal atom M via its carbene carbon atom or its terminal vinylidene carbon atom and/or its terminal allenylidene carbon atom. The complex is thus a carbene complex, a vinylidene complex and/or allenylidene complex. Carbene complexes generally refer to substances having a formal metal-sp$^2$ carbon double bond. There are typically two radicals bonded to what is called the carbene carbon atom—here R and R' in the case of the carbene complex with x=0, where, in the example of formula (2), m=1. Such a carbene complex thus conforms to the general formula (2):

formula (2)

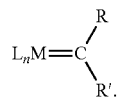

If, by contrast, there is just one carbon substituent bonded to the carbene carbon atom via a further double bond, the complexes are vinylidene complexes. In that case, such a vinylidene complex (if M=1) conforms to the general formula (3):

formula (3)

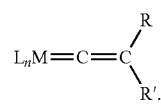

In the formula (3) shown above, the right-hand —CRR'— moiety thus corresponds to the abovementioned one carbon substituent, and the carbon atom shown on the left here is a carbene carbon atom since—apart from the complex bond to the metal atom M—it has only two covalent bonds to the adjacent carbon atom.

If the unsaturated carbon chain of the formula (3) is extended by one further carbon atom, what is obtained (if M=1) is an allenylidene complex of the general formula (4):

formula (4)

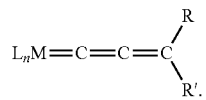

According to the general structure of formula (1), the n-dopant is thus composed of a formally uncharged metal-ligand fragment $L_nM$ and at least one further formally uncharged carbene, vinylidene and/or allenylidene ligand. Complexes of the general structure of formula (1) shall in each case also be understood to mean those complexes in which the m individual ligands of the (C)$_x$=CRR' type chosen are different. More particularly, it is possible here not just for the substituents R and R' of the individual m ligands chosen to be different; it is also possible for one or more carbene ligands to be present within a complex together with one or more vinylidene ligands and/or one or more allenylidene ligands. The inventive nature of the structure of the general formula (1) results in a particularly high level for the highest occupied molecular orbital (=HOMO), which has a particularly positive effect in respect of electron transport in the layer containing the n-dopant in question. This is firstly independent of whether the layer contains the n-dopant as an addition to a further electron transport material, or whether the n-dopant itself is the essential electron transport material in the layer.

The HOMO level is comparatively high in general terms for the group of substances described. A further advantage of the group of substances of formula (1) is that great structural variety is possible within this group of substances, and all representatives have a comparatively high HOMO level by virtue of the electron structure of the last carbene, vinylidene or allenylidene carbon atom bonded to the metal atom. In some embodiments, the exact level of this high-lying HOMO can be matched to the level of the molecular orbitals of adjacent layers and/or the level of the molecular orbitals of a further material likewise present in the electron-conducting layer. This can be achieved through the matching of the respective substituents R and R', the choice of carbene, vinylidene, and allenylidene ligands (optionally in combination) and the further ligands $L_n$ to the specifically desired HOMO levels.

In some embodiments, the compounds may have generally low sublimation temperatures and can therefore be deposited particularly easily in a layer by vacuum processing, especially by evaporation, by comparison with other known n-dopants, especially salt-type dopants. In contrast, the alkali metal and alkaline earth metal salts are difficult to sublime. In some embodiments, even though fundamentally different structural formulae can be used for representation, the salt-like character of these complexes is extremely low.

In some embodiments, x has values (for at least one of the m carbene-type ligands) of 1 or 2, and which are thus vinylidene or allenylidene complexes. The conductivity is particularly high even within the molecules along the linear unsaturated chain of multiple (here 1+x, i.e. 2 or 3 in total) carbon atoms bonded by double bonds. This also achieves particularly good conductivity based on the entire layer, and the electrical losses of an organic electronic component formed with such a layer are low. This is particularly effective for the allenylidene complexes (n=2 for at least one of the m carbene-type ligands), in which there is intramolecular electrical conductivity along a three-atom chain of carbon atoms bonded by double bonds. In some embodiments, at least two allenylidene ligands are present in one molecule. Especially when two allenylidene ligands are arranged in a linear manner with the metal atom in a molecule, this results in a very high intramolecular conductivity since charge transport can take place via a C=C=C=M=C=C=C chain.

In some embodiments, an organic electronic component has at least two electrodes and a layer as described above. In such a component, the layer acts correspondingly as described above, and the electron conductivity between the two electrodes may be increased compared to conventional organic components by virtue of the layer. This is not just because of the good electron conductivity of the layer, but also because of the generally high HOMO level. Such a high HOMO level is generally advantageous in order to transfer negative charge carriers, for example, to an electron transport material present within the same layer or an adjacent layer.

In some embodiments, a process as described serves for production of an organic electron-conducting layer. In the process, the n-dopant is deposited by means of a sublimation process. The n-dopants of the general structure of formula (1) have particularly good suitability for deposition in thin layers by sublimation.

Some embodiments include the use of an n-dopant having a general structure of formula (1) in order to increase the electron conductivity of an organic layer.

Advantageous configurations and developments of the teachings herein are apparent from the description which follows. It is possible here for the described configurations of the layer, of the component, of the process, and of the use to be combined with one another in a generally advantageous manner.

For instance, the R radical and/or the R' radical for at least one of the m carbene-type ligands may be a substituted heteroatom. More particularly, R and/or R' may in each case be a methoxy or amino group. In general, here and elsewhere in the n-dopant, the choice of heteroatoms may achieve fine adjustment of the conductivity and/or the HOMO level to the electrical properties of another component of the layer and/or of an adjacent layer.

For at least one of the m carbene-type ligands, R and R' may also be bridged as a common saturated or unsaturated carbo- or heterocycle, for example as a pyrrole, pyrazole or imidazole. The heteroatoms here may occur in any position in the ring. In other words, R and R' (or at least parts thereof) together with the carbon atom shown on the right in formula (1) may be part of such a carbo- or heterocycle. In some embodiments, rings may be composed of 4, 5, 6, 7 or 8 cyclically bonded atoms. These rings may also be substituted, for example by substituents selected from the group of the alkyls, aryls, alkylaryls, heteroalkyls, heteroaryls, the alkyls, aryls, alkylaryls, heteroalkyls, heteroaryls substituted by functional groups, and the substituted heteroatoms.

One or more of the n ligands L may comprise substituted benzyl ligands. When one or more ligands L are chosen as a substituted heteroatom, this may especially be a ligand of the —PR"$_3$ or —NR"$_2$ type where P is phosphorus, N is nitrogen and R" is one of two or more (3 or 2) radicals that may each independently be selected from the group of the alkyls, aryls, alkylaryls, heteroalkyls, heteroaryls, the alkyls, aryls, alkylaryls, heteroalkyls, heteroaryls substituted by functional groups, and the substituted heteroatoms.

In some embodiments, two or more ligands L may be bridged to one another as a higher ring structure. These may be bridged in the form of at least one saturated or unsaturated carbo- or heterocycle, for example in the form of a supra-ligand bipyridine, phenylpyridine, terpyridine or 1,2-bis(diphenylphosphino)ethane structure. In other words, the higher structure of the ligands L may then be a common polydentate ligand. In general, in the case of a bridged heterocyclic structure, the heteroatom(s) may occur in any position in the ring. Here too, irrespective of whether the cycle is a carbo- or heterometallacycle, preference is given to rings composed of 4, 5, 6, 7 or 8 cyclically bonded atoms. Such a metallacycle shall generally be understood to mean a cycle that extends over the metal atom and two ligands. These rings may also be substituted, for example by substituents selected from the group of the alkyls, aryls, alkylaryls, heteroalkyls, heteroaryls, the alkyls, aryls, alkylaryls, heteroalkyls, heteroaryls substituted by functional groups, and the substituted heteroatoms.

The metal atom M may be selected from the group consisting of palladium, platinum, silver and gold. It is easily possible to prepare uncharged complexes by reduction of charged complexes with gold as metal atom. The metal platinum may also be excluded from the group specified in claim 1, since platinum is used in known emitter materials for organic electronic light-emitting diodes. However, the layer described is not supposed to be primarily an emitter layer of an electronic component but an electron transport layer of such a component. Emission within the electron transport layer is disadvantageous for many applications, since this usually adversely affects the efficiency of the component.

In some embodiments, the total number n+m of the ligands on the metal atom M may be even. In some embodiments, the total number n+m=2, since complexes of this kind can be produced comparatively easily by known preparation methods.

The layer thickness of the electron-conducting layer may be between 10 nm and 1000 nm, e.g. between 20 nm and 200 nm. A layer thickness within one of the ranges mentioned may be suitable for transporting electrons between the other adjacent layers of a layer stack in an organic electronic component. When an even smaller layer thickness is chosen, the layer may under some circumstances no longer be sufficiently homogeneous and/or may not form continuous coverage of the layer beneath. In the case of a significantly higher layer thickness, charge carrier transport, which can be brought about, for example, by a potential difference at right angles to the plane of the layer, may be too significantly restricted since the local electrical field for a given potential difference is too low at excessively high layer thicknesses.

In some embodiments, the number m of carbene, vinylidene and/or allenylidene ligands bonded to the metal atom M is 1 or 2. For complexes of this kind as well, the uncharged forms of complex are relatively easily preparable by preparation methods that are known in principle.

In some embodiments, the electron-conducting layer, in addition to the n-dopant mentioned, may include a further electron transport material. This may thus be an electron transport layer into which the n-dopant has been doped and/or mixed merely as one of multiple constituents. Such mixing and/or doping may increase the conductivity of the electrode material.

The further electron transport material may, for example, be one or more of the following compounds: 2,2',2"-(1,3,5-benzenetriyl)tris(1-phenyl-1H-benzimidazole); 2-(4-biphenylyl)-5-(4-tert-butylphenyl)-1,3,4-oxadiazole; 2,9-dimethyl-4,7-diphenyl-1,10-phenanthroline (BCP); 8-hydroxyquinolinolato-lithium; 4-(naphthalen-1-yl)-3,5-diphenyl-4H-1,2,4-triazole; 1,3-bis[2-(2,2'-bipyridin-6-yl)-1,3,4-oxadiazol-5-yl]benzene; 4,7-diphenyl-1,10-phenanthroline (BPhen); 3-(biphenylyl)-4-phenyl-5-tert-butylphenyl-1,2,4-triazole; bis(2-methyl-8-quinolinolate)-4-(phenylphenolato)-aluminum; 6,6'-bis[5-(biphenyl-4-yl)-1,3,4-oxadiazol-2-yl]-2,2'-bipyridyl; 2-phenyl-9,10-di(naphthalen-2-yl)anthracene; 2,7-bis[2-(2,2'-bipyridin-6-yl)-1,3,4-oxadiazol-5-yl]-9,9-dimethylfluorene; 1,3-bis[2-(4-tert-butylphenyl)-1,3,4-oxadiazol-5-yl]benzene; 2-(naphthalen-2-yl)-4,7-diphenyl-1,10-phenanthroline; 2,9-bis(naphthalen-2-yl)-4,7-diphenyl-1,10-phenanthroline; tris(2,4,6-trimethyl-3-(pyridin-3-yl)phenyl)-borane; 1-methyl-2-(4-(naphthalen-2-yl)phenyl)-1H-imidazo[4,5-f][1,10]phenanthroline; phenyldipyrenylphosphine oxide; naphthalenetetracarboxylic dianhydride or imides thereof; perylenetetracarboxylic dianhydride or imides thereof; 2,3,5,6-tetrafluoro-7,7,8,8-tetracyanoquinodimethane; pyrazino[2,3-f]-[1,10]phenanthroline-2,3-dicarbonitrile; dipyrazino[2,3-f:2',3'-h]quinoxaline-2,3,6,7,10,11-hexacarbonitrile.

Further useful electron transport materials are, for example, those based on siloles having a silacyclopentadiene unit or heterocycles as described in EP 2 092 041 B1.

In some embodiments, the layer may also include an electron acceptor material. Such an electron acceptor material may include, for example, one or more of the following compounds: 2,3,5,6-tetrafluoro-7,7,8,8-tetracyanoquinodimethane; pyrazino[2,3-f][1,10]phenanthroline-2,3-dicarbonitrile and/or dipyrazino[2,3-f:2',3'-h]quinoxaline-2,3,6,7,10,11-hexacarbonitrile.

In some embodiments, the further electron transport material and/or electron acceptor material may form a matrix into which the n-dopant has been mixed. In some embodiments, the proportion by volume and/or the proportion by mass may be between 0.01% and 35%. In some embodiments, the proportion by volume and/or the proportion by mass may be between 2% and 20%. In the case of a proportion of the n-dopant within the value ranges mentioned, it is possible to achieve a particularly effective improvement in the electron conductivity of the layer by comparison with the pure matrix material.

In some embodiments, as an alternative to doping or admixture in a matrix, the n-dopant may also be present as a main constituent of the layer. More particularly, the proportion by volume and/or the proportion by mass of the n-dopant may be between 70% and 100%. In the case of such a high proportion, the conductivity of the layer is determined mainly by the electrical properties of the n-dopant, which can likewise lead to very good electron conductivity of the layer in an organic electronic component. It is thus even possible for there to be a layer that consists solely of the n-dopant mentioned.

In some embodiments, the organic electronic component may comprise an organic light-emitting diode (=OLED), of an organic solar cell, of an organic photodetector and/or of an organic transistor. An organic transistor may comprise an organic field-effect transistor or an organic bipolar transistor. As a result of the improved electron transport properties of the layer, such a layer is particularly suitable for construction of the abovementioned organic electrical components. It is especially possible here to obtain components having improved electronic properties, especially lower losses and/or better efficiencies, and also improved service lives.

In the case of execution of the organic electronic component as an OLED, this may have, in addition to the electron-conducting layer, a separate emitter layer disposed between the electron-conducting layer and at least one of the electrodes. The electron-conducting layer mentioned is thus explicitly not to be the emitter layer of the OLED which is mainly effective in respect of the emission of light; instead, it may be an additional electron transport layer which brings about the transport of electrons between one of the electrodes and the emitter layer.

In some embodiments, the layer in the organic electronic component may comprise part of a charge generation layer (CGL). Such a charge generation layer may comprise at least one n-conducting layer and at least one p-conducting layer. In the n-conducting layer, the n-dopant mentioned may be used as described above.

In some embodiments, the process for producing the layer may include depositing the n-dopant within the layer together with at least one electron transport material. This deposition may, for example, be a co-deposition. In some embodiments, it is also possible to sequentially deposit a multitude of successive sublayers composed of the materials mentioned, as a result of which it is possible overall to achieve a mixture of the individual components again in the overall layer.

The sublimation operation encompassed by the process can be affected at a temperature between 120° C. and 600° C. The pressure here may be between $1*10^{-5}$ mbar and $1*10^{-9}$ mbar. The process window mentioned may be suitable for inexpensive application of the n-dopants described in a homogeneous layer without damaging the material and especially the electron transport properties thereof. In the sublimation process described, irrespective of the exact process conditions, the n-dopant and an additional electron transport material can simultaneously be co-resublimed as a layer.

In some embodiments, as an alternative to the sublimation operation mentioned (in which the sublimed material is generally subsequently resublimed in the layer), the n-dopant may be deposited from a liquid. If the layer also comprises a further electron transport material, for example, both substances can be deposited together from a liquid mixture. Irrespective of the composition of the liquid to be processed (with or without additional electron transport material), this liquid can be processed by commonly known methods from organic semiconductor technology, for example by spin-coating, slot-coating, bar-coating, or various printing methods, for example inkjet printing or screen-printing.

The teachings of the present disclosure may include embodiment wherein the electron transport layer 7 of the organic light-emitting diode 10 in FIG. 1 is configured as a layer. In the case of an organic light-emitting diode of such a configuration, luminescence (in cd/m²), efficiency (in cd/A) and/or lifetime (in h) can be increased by comparison with conventional OLEDs, since these indices depend on the exciton density in the light-emitting layer 5 and/or on the quality of the charge carrier injection into this layer. Both properties can be improved by the increase in the electron conductivity in the electron transport layer 7.

Figure 2:
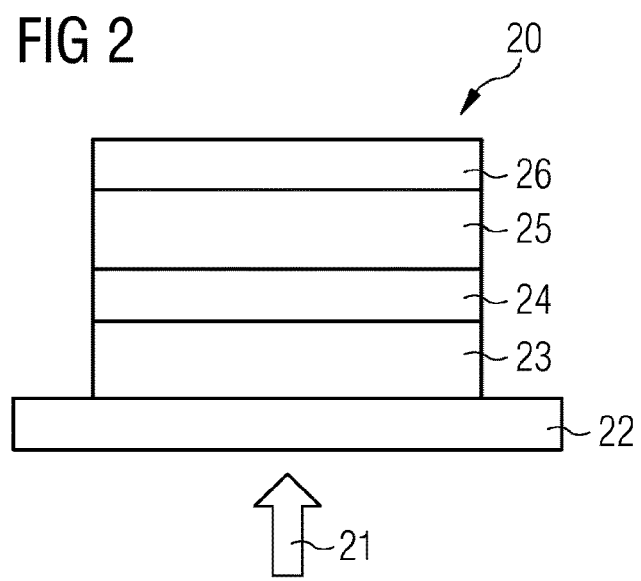
FIG. 2 a schematic of the structure of an organic solar cell or of an organic photodetector having PIN structure (20), which converts light (21) to electrical current. The component comprises a layer of indium tin oxide (22); a p-doped layer (23); an absorption layer (24); an n-doped layer (25) and a metal layer (26)

In some embodiments, the n-doped layer 25 of the organic solar cell 20 is configured according to FIG. 2. In some embodiments, it is also possible to use an organic component with a layer structure according to FIG. 2 as an organic photodetector. The efficiency of such a solar cell and/or such a photodetector is particularly high when there is a minimum drop in voltage across such an n-doped electron transport layer 25.

In some embodiments, the hatched regions of the semiconductor layer 36 are configured as a layer. In some embodiments, the contact resistances there can be kept particularly small, which leads overall to high effective mobility of the charge carriers in the component. In circuits with such transistors, it is thus possible to achieve particularly high switching frequencies.

Example 1

A layer according to a first working example comprises an n-dopant as apparent from the formula (5) below:

formula (5)

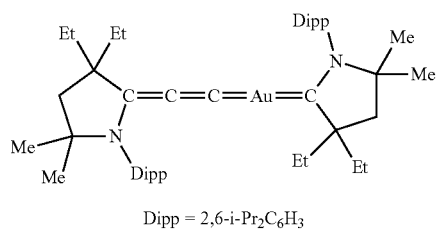

A $Dipp = 2,6-i-Pr_2C_6H_3$

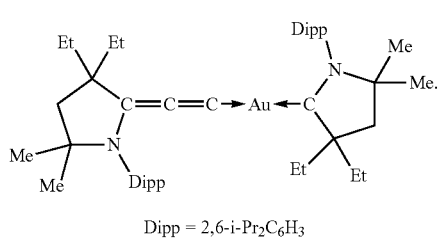

B $Dipp = 2,6-i-Pr_2C_6H_3$

What are shown are two alternative structural formulae A and B of the same complex, which is a formally uncharged compound overall. The metal atom here is gold. The gold atom here can formally be assigned the oxidation state of zero, and carbene ligands shown on the right and the allenylidene ligands shown on the left can be considered to be uncharged. However, calculations show that the electron density on the gold atom is comparatively low, and these complexes can therefore also be regarded as Au(I) complexes having an anionic paramagnetic allenylidene ligand. Such a compound can be represented schematically either as structure A with double bonds or as structure B with a coordination arrow. Both notations are embraced here. In the case of the general complexes of the type of formula (1) too, overall, all complex structures of this kind that can be represented schematically by one of these corresponding formulae may be appropriate. Structures that, according to their electron density, can be alternatively or possibly even better represented by a different schematic notation shall also be embraced here.

The preparation of the complexes described herein can include a reduction of a cationic precursor, for example in its last step. Conversely, in the layer described, for example when it contains a further material, an electron can be transferred back to this material. More particularly, the layer may contain electron transport material, for example from the aforementioned list. In that case, an electron can be transferred to the electron transport material (ETM), as apparent from the reaction scheme below:

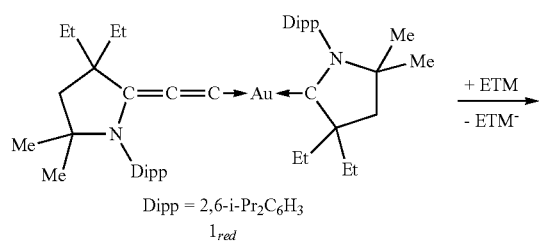

Dipp = 2,6-i-Pr$_2$C$_6$H$_3$
$1_{red}$

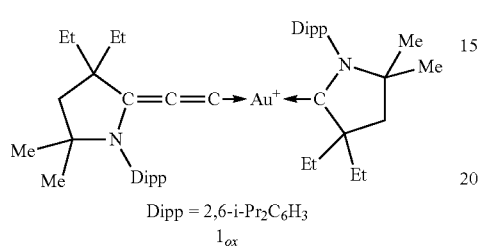

Dipp = 2,6-i-Pr$_2$C$_6$H$_3$
$1_{ox}$

According to this scheme, the complex shown on the left, in the first working example, which is in its reduced form $1_{red}$, is converted to its oxidized form $1_{ox}$ by electron transfer to the electron transport material ETM which may likewise be present within the same layer. By contrast, the transfer of the electron in the electron transport material forms the reduced form ETM$^-$, which crucially improves electron transport in this material by virtue of an increased number of free charge carriers (electrons).

In general, in the complexes described, the oxidized forms corresponding to the structures of the formula (1) shall be embraced analogously to $1_{ox}$. Especially in the case of the proportions of this complex mentioned in such layers in which a further material is also present, these oxidized forms shall also be regarded as part of this proportion.

In some embodiments, alternatively or additionally to the oxidation of the complex shown, it is also possible to form a charge transfer complex with the complex of general formula (1) as donor and the electron transport material as acceptor. In other words, it is not necessary for a whole electron to be transferred in the manner of a chemical oxidation. There may also be partial transfer in the manner of additional complex formation in the form of a charge transfer complex. In this case too, the partial transfer of an electron to the electron transport material increases the conductivity thereof is achieved.

The described (complete or partial) transfer of an electron from the complex to the electron transport material are extremely electron-rich. For instance, the complex $1_{ox}$ according to the first working example has a reduction potential of −1.73 V versus Fc$_+$/Fc. Fc$^+$ corresponds here to the ferrocenium cation and Fc corresponds to ferrocene. The reversible oxidation of Fc to Fc$^+$ is used here as an internal reference (analogously to a reference electrode) in the electrochemical determination of oxidation and reduction potentials by means of cyclic voltammetry. This reduction potential corresponds to a HOMO level of −3.07 eV relative to vacuum level for the n-dopant $1_{red}$.

Example 2

A layer according to a second working example comprises an alternative second n-dopant as apparent from the formula (7) below:

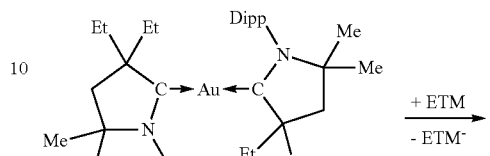

Dipp = 2,6-i-Pr$_2$C$_6$H$_3$
$2_{red}$

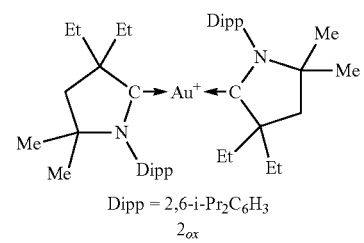

Dipp = 2,6-i-Pr$_2$C$_6$H$_3$
$2_{ox}$

Here too, the reduced form of the second n-dopant $2_{red}$ is shown on the left as the starting material present in the layer, while the right-hand part of the scheme of formula (7) shows the oxidized form $2_{ox}$, obtainable, for example, via transfer of an electron to an electron transport material (ETM) likewise present in the layer. For this second n-dopant, the reduced complex $2_{red}$ is actually an even stronger electron donor than the corresponding reduced complex $1_{red}$. Thus, $2_{red}$ has an oxidation potential of −2.24 V versus Fc$^+$/Fc, which corresponds to a HOMO level of −2.56 eV relative to vacuum level. Such a high-lying HOMO is actually even more favorable for the promotion of electron conductivity in the layer than the first n-dopant described.

Figure 4:
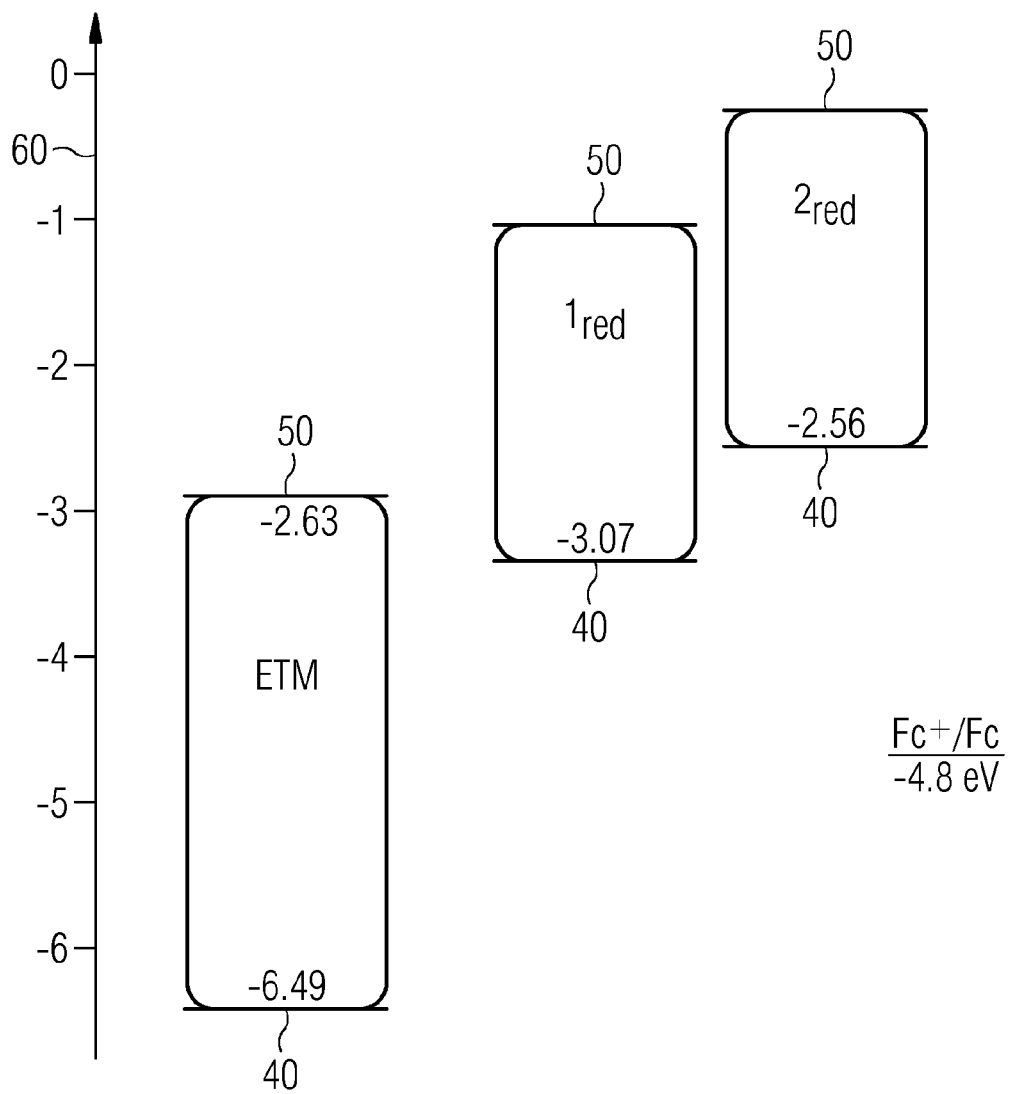
FIG. 4 a schematic of the levels of the molecular orbitals for two illustrative n-dopants by comparison with an illustrative electron transport material.

FIG. 4 illustrates the HOMO and LUMO levels (LUMO=lowest unoccupied molecular orbital) for the two n-dopants described $1_{red}$ and $2_{red}$ by comparison with an illustrative electron transport material ETM having typical levels of the molecular orbitals. The vertical heights of the boxes shown in each case symbolize the band gap of the materials, the respective HOMO being identified by the reference numeral 40 and the respective LUMO by the reference numeral 50. The LUMO level here is an approximate value. The values on the axis 60 give the level of these molecular orbitals in electron-volts (eV) relative to vacuum. Also shown for comparison is the Fc$^+$/Fc level, from which the HOMO levels can be calculated using the oxidation potentials. Electron transfer from the HOMO of the complex $1_{red}$ to the LUMO of the electron transport material is readily possible since this LUMO is higher but very close in energy to the HOMO of $1_{red}$. However, an occupied LUMO in the electron transport material specifically enables efficient electron transport in this material. The situation is even more favorable for the complex $2_{red}$, since the HOMO here is even higher at −2.56 eV. This is an extreme example in which the LUMO of the electron transport material is lower than the HOMO of an n-dopant in a mixture therein.

Example 3

A layer according to a third working example comprises an alternative third n-dopant as apparent from the general formula (8) below:

formula (8)

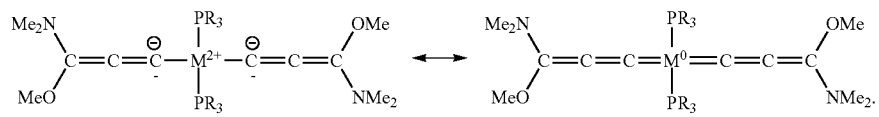

The metal atom M herein is selected from the group comprising palladium or platinum, and the R radicals of the two phosphorus atoms are independently selected from the group of the alkyl and/or aryl radicals. This complex is a bis(allenylidene) complex that can be obtained, for example, from a corresponding doubly charged complex cation by reduction with a strong reducing agent such as $C_8K$. Here too, it is possible to generate such a cation again by transferring electrons to an electron transport material likewise present within the layer of the invention. In this third example, it is thus even possible to transfer to electrons per complex molecule to the electron transport material, which is very particularly favorable for the increase in electron conductivity in this material.

Figure 3:
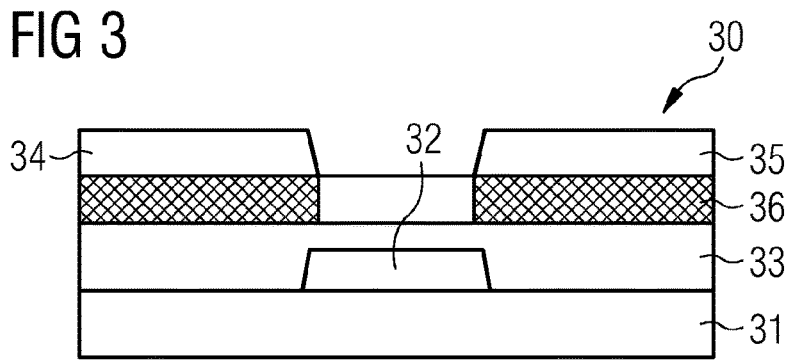
FIG. 3 a schematic of a possible cross section of an organic field-effect transistor (30). Applied atop a substrate (31) are a gate electrode (32), a gate dielectric (33), a source and drain contact (34+35) and an organic semiconductor (3*b*). The hatched areas show the sites at which contact doping is helpful.

The layers in the three working examples described can be used, for example, as electron transport layers in the various above-described component types. For instance, the different layers of the invention can be used, for example, as layer 7 of the OLED 10 shown in FIG. 1, as layer 25 of the solar cell shown in FIG. 2, or as hatched subregion of the layer 36 in the transistor shown in FIG. 3.

What is claimed is:
1. An organic electron-conducting layer comprising:
   an n-dopant having the structure

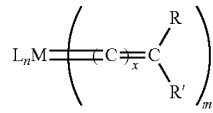

wherein $L_n$ denotes a number n of ligands L, each ligand L independently selected from the group consisting of: alkyls, aryls, alkylaryls, heteroalkyls, and alkyls, aryls, alkylaryls, or heteroalkyls substituted by functional groups, and substituted heteroatoms;
   wherein M comprises a metal selected from the group consisting of: iron, ruthenium, osmium, rhodium, iridium, nickel, palladium, platinum, copper, silver, and gold, and M is connected directly by a double bond to a carbon atom;
   wherein R and R' comprise compounds connected by a single bond to a carbon atom and independently selected from the group consisting of: alkyls, aryls, alkylaryls, heteroalkyls, heteroaryls, and alkyls, aryls, alkylaryls, or heteroalkyls substituted by functional groups, and substituted heteroatoms;
   wherein n is from 0 to 5;
   wherein m is from 1 to 6;
   wherein n+m is from 2 to 6; and
   wherein x has a value of 1 or 2.

2. The layer as claimed in claim 1, wherein at least one of R and/or R' comprises a substituted heteroatom.
3. The layer as claimed in claim 1, wherein M comprises: palladium, platinum, silver, or gold.
4. The layer as claimed in claim 1, comprising part of a charge generation layer.
5. The layer as claimed in claim 1, having a thickness between 10 nanometers and 1000 nanometers.
6. The layer as claimed in claim 1, wherein:
   n is at least two; and
   the ligands L are bridged to one another in the form of a higher ring structure.
7. The layer as claimed in claim 1, further comprising a further electron transport material and/or electron acceptor material.
8. The layer as claimed in claim 7, wherein the further electron transport material and/or electron acceptor material forms a matrix into which the n-dopant has been mixed.
9. The layer as claimed in claim 1, wherein the n-dopant comprises between 70% and 100% by volume of the layer.
10. An organic electronic component comprising:
    at least two electrodes; and
    a layer of an n-dopant having the structure:

wherein $L_n$ denotes a number n of ligands L, each ligand L independently selected from the group consisting of: alkyls, aryls, alkylaryls, heteroalkyls, heteroaryls, or alkyls, aryls, alkylaryls, and heteroalkyls substituted by functional groups, and substituted heteroatoms;
    wherein M comprises a metal selected from the group consisting of: iron, ruthenium, osmium, rhodium, iridium, nickel, palladium, platinum, copper, silver, and gold, and M is connected directly by a double bond to a carbon atom;
    wherein R and R' comprise compounds connected by a single bond to a carbon atom and independently selected from the group consisting of: alkyls, aryls, alkylaryls, heteroalkyls, heteroaryls, or alkyls, aryls, alkylaryls, and heteroalkyls substituted by functional groups, and substituted heteroatoms;
    wherein n is from 0 to 5;
    wherein m is from 1 to 6;
    wherein n+m is from 2 to 6; and
    wherein x has a value of 1 or 2.
11. The organic electronic component as claimed in claim 10, wherein the component comprises an organic light-emitting diode, an organic solar cell, an organic photodetector, and/or an organic transistor.

12. The organic electronic component as claimed in claim 11, comprising an organic light-emitting diode with a separate emitter layer disposed between an electron-conducting layer and at least one of the electrodes.

13. A process for producing an organic electron-conducting layer, the process comprising:
depositing a layer of an n-dopant by sublimation;
wherein the n-dopant has the structure:

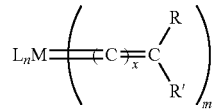

wherein $L_n$ denotes a number n of ligands L, each ligand L independently selected from the group consisting of: alkyls, aryls, alkylaryls, heteroalkyls, or alkyls, aryls, alkylaryls, and heteroalkyls substituted by functional groups, and substituted heteroatoms;
wherein M comprises a metal selected from the group consisting of: iron, ruthenium, osmium, rhodium, iridium, nickel, palladium, platinum, copper, silver, and gold, and M is connected directly to a carbon atom by a double bond;
wherein R and R' comprise compounds connected by a single bond to a carbon atom and independently selected from the group consisting of: alkyls, aryls, alkylaryls, heteroalkyls or alkyls, aryls, alkylaryls, and heteroalkyls substituted by functional groups, and substituted heteroatoms;
wherein n is from 0 to 5;
wherein m is from 1 to 6;
wherein n+m is from 2 to 6; and
wherein x has a value of 1 or 2.

14. The process as claimed in claim 13, wherein the n-dopant is deposited within the layer together with at least one electron transport material.

15. A method comprising using an n-dopant for increasing the electron conductivity of an organic layer;
wherein the n-dopant has the structure:

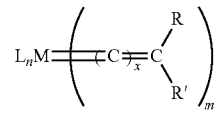

wherein $L_n$ denotes a number n of ligands L, each ligand L independently selected from the group consisting of: alkyls, aryls, alkylaryls, heteroalkyls, or alkyls, aryls, alkylaryls, and heteroalkyls substituted by functional groups, and substituted heteroatoms;
wherein M comprises a metal selected from the group consisting of: iron, ruthenium, osmium, rhodium, iridium, nickel, palladium, platinum, copper, silver, and gold, and M is connected directly to a carbon atom by a double bond;
wherein R and R' comprise compounds connected to a carbon atom by a single bond and independently selected from the group consisting of: alkyls, aryls, alkylaryls, and heteroalkyls or alkyls, aryls, alkylaryls, and heteroalkyls substituted by functional groups, and substituted heteroatoms;
wherein n is from 0 to 5;
wherein m is from 1 to 6;
wherein n+m is from 2 to 6; and
wherein x has a value of 1 or 2.

* * * * *